(12) United States Patent
Wiesendanger et al.

(10) Patent No.: US 8,789,432 B2
(45) Date of Patent: Jul. 29, 2014

(54) INSPECTION VEHICLE FOR INSPECTING AN AIR GAP BETWEEN THE ROTOR AND THE STATOR OF A GENERATOR

(75) Inventors: Markus Wiesendanger, Zürich (CH); Wolfgang Fischer, Zürich (CH)

(73) Assignee: ALSTOM Technology Ltd, Baden (CH)

( * ) Notice: Subject to any disclaimer, the term of this patent is extended or adjusted under 35 U.S.C. 154(b) by 574 days.

(21) Appl. No.: 12/886,690

(22) Filed: Sep. 21, 2010

(65) Prior Publication Data

US 2011/0175641 A1 Jul. 21, 2011

Related U.S. Application Data

(60) Provisional application No. 61/296,199, filed on Jan. 19, 2010.

(30) Foreign Application Priority Data

Aug. 16, 2010 (CH) .................................... 1312/10

(51) Int. Cl.
G01D 21/00 (2006.01)
(52) U.S. Cl.
USPC ..................... 73/866.5; 73/865.8; 324/765.01
(58) Field of Classification Search
USPC ..................... 324/219, 220, 545, 546, 765.01; 73/622, 623, 865.8, 866.5; 310/66, 310/67 R, 68 R
See application file for complete search history.

(56) References Cited

U.S. PATENT DOCUMENTS

| | | | | |
|---|---|---|---|---|
| 5,563,357 A * | 10/1996 | Longree | ....................... | 73/866.5 |
| 5,635,780 A * | 6/1997 | Kohlert et al. | .............. | 310/68 R |
| 6,198,277 B1 * | 3/2001 | Porter et al. | .................. | 324/220 |
| 6,924,650 B2 * | 8/2005 | Haeusermann et al. | ...... | 324/546 |
| 8,220,345 B2 * | 7/2012 | Moser et al. | .................. | 73/866.5 |
| 2007/0223643 A1* | 9/2007 | Yamane et al. | ................ | 376/249 |
| 2007/0277630 A1* | 12/2007 | Bagley et al. | ................ | 73/865.9 |
| 2008/0087112 A1 | 4/2008 | Bagley et al. | | |
| 2009/0146680 A1* | 6/2009 | Moser et al. | .................. | 324/772 |
| 2009/0256584 A1* | 10/2009 | Moser et al. | .................. | 324/772 |

FOREIGN PATENT DOCUMENTS

| | | |
|---|---|---|
| EP | 1233278 | 8/2002 |
| WO | WO93/00592 | 1/1993 |

OTHER PUBLICATIONS

Search Report for Swiss Patent App. No. 1312/2010 (Dec. 23, 2010).

* cited by examiner

*Primary Examiner* — Hezron E Williams
*Assistant Examiner* — Hoang Nguyen

(57) ABSTRACT

An inspection vehicle (24) for inspecting an air gap (14) between the rotor (11) and the stator (12) of a generator (10) includes drive elements (26, 27) for the independent progressive movement in the air gap (14). A particularly compact construction and flexible application is achieved by the drive elements (26, 27) being formed as elongated, flexionally elastic, torsionally rigid, magnetic rolls.

23 Claims, 6 Drawing Sheets

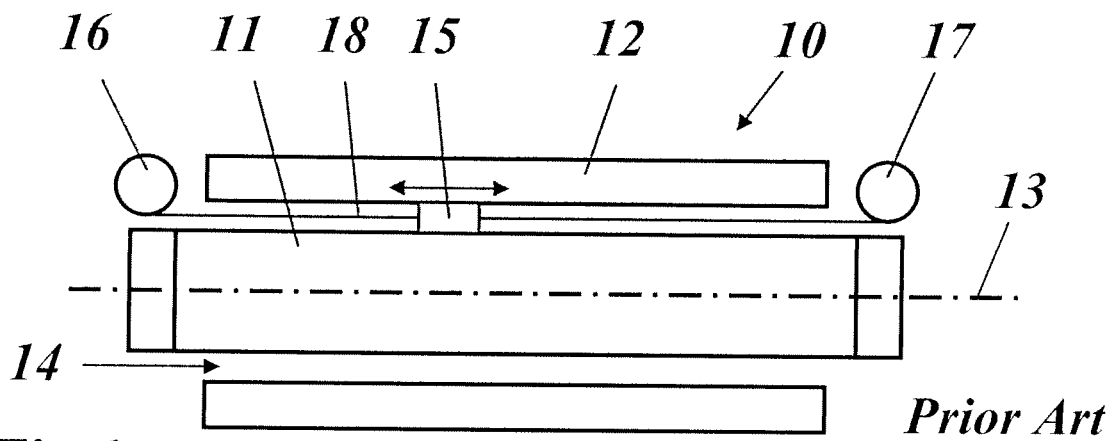
*Fig.1* *Prior Art*
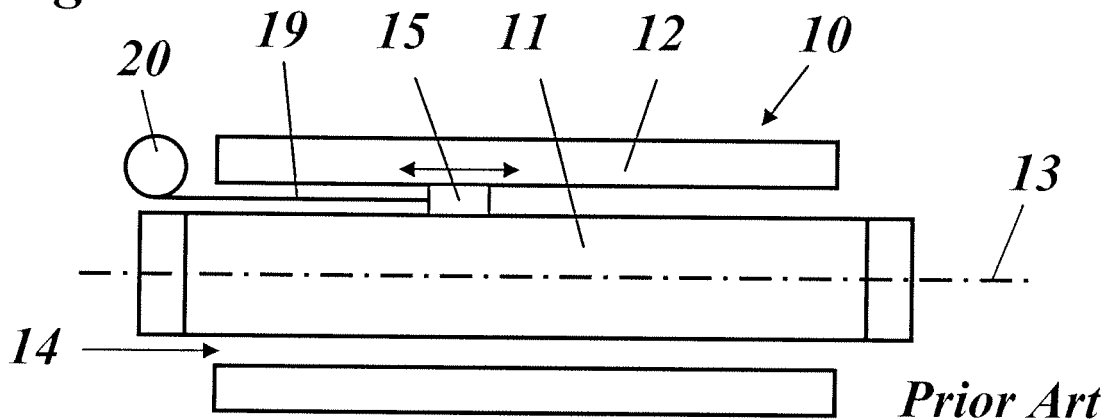
*Fig.2* *Prior Art*
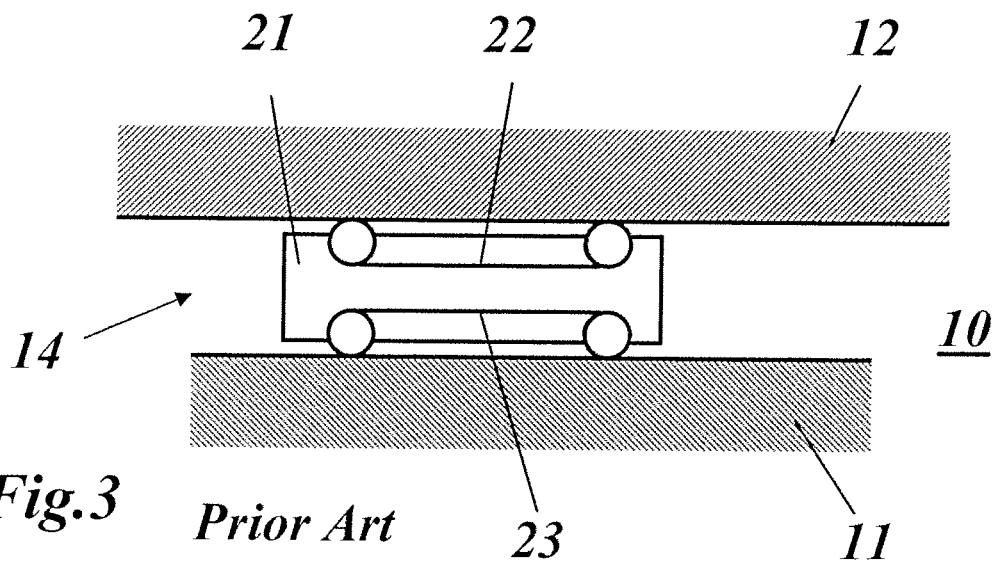
*Fig.3* *Prior Art*

INSPECTION VEHICLE FOR INSPECTING AN AIR GAP BETWEEN THE ROTOR AND THE STATOR OF A GENERATOR

This application claims priority under 35 U.S.C. §119 to U.S. Provisional Application No. 61/296,199, filed 19 Jan. 2010, and to Swiss Application No. 01312/10, filed 16 Aug. 2010, the entireties of which are incorporated by reference herein.

BACKGROUND

1. Field of Endeavor

The present invention relates to the field of electric heavy-duty generators, and more specifically to an inspection vehicle for inspecting an air gap between the rotor and the stator of such a generator.

2. Brief Description of the Related Art

The inspection of air gaps in large generators in the assembled state has the advantage that the rotor does not have to be withdrawn from the generator, but only minimal operations need to be undertaken for opening the casing. This leads to great time savings and shortens the downtimes of the generator considerably.

For the inspection, an inspection device is introduced into the air gap, that is to say into the gap between rotor and stator, with which the outer surface of the rotor can be inspected visually and electromagnetically, as well as the inner surface of the stator. Furthermore, the mechanical integrity of the windings and the associated winding wedges can be checked. The air gap customarily has a width of between 10 and 30 mm, but with the rotor installed, the width of the access between the end ring of the generator and the stator may even be only about 9 mm.

In the past, a large number of devices for in-situ inspection in the air gap of generators have already been proposed. All known devices and methods have some disadvantages. Often, they are not universal enough to be easily adapted to the different generator geometries, and the devices are frequently too large to be introduced through a standard inspection opening in the generator. Their size leads to a partial opening of the casing, which costs valuable time and leads to an outage of the machine.

In the prior art, three main families of in-situ inspection devices for the air gaps of generators can be distinguished: the first can be referred to as a "cable car" device. Such a device is schematically shown in FIG. 1. A sensor carrier 15 is introduced into the air gap 14 of the generator 10 between a central rotor 11 and a stator 12 which concentrically encloses the rotor 11, and is fastened on a wire 18 which is guided in the axial direction through the air gap 14 and by reels 16 and 17, which are arranged at the ends, can be moved back and forth in the axial direction (see the double arrow). A comparable device is disclosed in printed publication EP 1 233 278 A2. In the case of this device, it is disadvantageous that, with simultaneous removal of large parts of the casing, the device has to be inconveniently fastened on the generator.

A second family, the construction of which is schematically reproduced in FIG. 2, instead of the continuous wire uses a thin, inherently stiff band 19, on the free end of which the sensor carrier 15 is fastened. The band 19 can be displaced in the axial direction by a roll-up mechanism 20. As in the case of the solution of FIG. 1, in this case the roll-up mechanism can be moved around the rotor 11 in the circumferential direction in order to reach all regions of the rotor top surface or of the stator inner surface with the sensor carrier 15. Also in this case, the main disadvantage lies in the fastening on the generator and the disassembly cost which is associated therewith.

The third family of inspection devices, which is schematically shown in FIG. 3, includes a robot 21 as the central component, which can be moved autonomously in the air gap 14 by it being rolled over, and consequently moved along, the surfaces of the rotor 11 and of the stator 12 via tracked drives 22, 23 which are arranged on the upper side and lower side. The tracked drives 22, 23 are pressed onto the respective surface by a spreader mechanism in the process in order to achieve sufficient friction for the drive and accurate positioning. Such a solution is known for example from printed publication US 2008/0087112 A1. Such a robot on the one hand is very costly in construction and operation, and on the other hand is not compact enough to be introduced from the outside into the air gap of different generators and to be moved in all regions there.

SUMMARY

One of numerous aspects of the present invention involves an inspection vehicle which can avoid the disadvantages of known solutions and which is especially characterized by simplicity in construction, robustness, great maneuverability and high flexibility in use.

Another aspect relates to an inspection vehicle in which the drive elements are formed as elongated, flexionally elastic, torsionally rigid, magnetic rolls. With these rolls, the vehicle is held simultaneously on the magnetizable rotor or stator and is moved progressively by rotation of the rolls. The flexibility of the rolls ensures that the rolls can be adapted to the curved surface in the air gap and so can optimize not only the magnetic adhesion but also the friction between roll and surface which is required for the drive. The elongated shape of the elements ensures that a sufficiently large magnetizable area of the rotor or stator is always covered.

One development of an inspection vehicle according to principles of the present invention is characterized in that the drive elements have the form of a flexible tube section in each case.

Another development of an inspection vehicle according to principles of the present invention is characterized in that a multiplicity of permanent magnets is arranged inside the drive elements one behind the other in the longitudinal direction.

Another development of an inspection vehicle according to principles of the present invention is characterized in that the drive elements comprise flexionally elastic, torsionally rigid shafts, on which a multiplicity of permanent magnets are arranged in each case one behind the other in the longitudinal direction in a rotation-resisting manner.

Another development of an inspection vehicle according to principles of the present invention is characterized in that the permanent magnets are of cylindrical or hollow-cylindrical design, wherein the cylinder axis is oriented parallel to the longitudinal axis of the drive elements in each case.

Another development of an inspection vehicle according to principles of the present invention is characterized in that the permanent magnets are magnetized parallel to the cylinder axis in each case.

A further development of an inspection vehicle according to principles the present invention is characterized in that the permanent magnets of a drive element are arranged inside a flexible tube.

Another development of an inspection vehicle according to principles of the present invention is characterized in that the flexible tube is a rubber tube.

Another development of an inspection vehicle according to principles of the present invention is characterized in that the flexible tube has an outside diameter which is constant over the longitudinal axis.

Another development of an inspection vehicle according to principles of the present invention is characterized in that the permanent magnets of a shaft are covered with a protective sheath.

Another development of an inspection vehicle according to principles of the present invention is characterized in that the inspection vehicle has a housing or a carrier structure with sensors which are required for the inspection, and in that at least one drive element is arranged in each case on opposite sides of the housing or of the carrier structure.

Another development of an inspection vehicle according to principles of the present invention is characterized in that a plurality of drive elements is arranged in each case on one side of the housing or of the carrier structure.

Another development of an inspection vehicle according to principles of the present invention is characterized in that the drive elements with their longitudinal axes are arranged parallel to each other, and in that the drive elements are connected to the housing or to the carrier structure in a manner in which they are rotatable around their longitudinal axes.

Another development of an inspection vehicle according to principles of the present invention is characterized in that the drive elements are individually driven, and in that, for each of the drive elements, provision is made in the housing or in the carrier structure for a motor which sets the associated drive element in rotation around its longitudinal axis.

Another development of an inspection vehicle according to principles of the present invention is characterized in that a control unit for controlling the motors is accommodated in the housing or in the carrier structure.

Another development of an inspection vehicle according to principles of the present invention is characterized in that the rotational direction of the drive elements is variable in each case.

Another development of an inspection vehicle according to principles of the present invention is characterized in that the flexionally elastic, torsionally rigid, magnetic rolls of the drive elements are mounted in correspondingly flexionally elastic frames which prevent distortion of the rolls around an axis which is perpendicular to the roll surface of the rolls.

BRIEF DESCRIPTION OF THE DRAWINGS

The invention shall subsequently be explained in more detail based on exemplary embodiments in conjunction with the drawing. In the drawings:

FIG. 1 shows, in a greatly simplified view, a method for inspecting the air gap of a generator according to the prior art;

FIG. 2 shows, in a greatly simplified view, another method for inspecting the air gap of a generator according to the prior art;

FIG. 3 shows, in a greatly simplified view, a vehicle for inspecting the air gap of a generator according to the prior art;

DETAILED DESCRIPTION OF EXEMPLARY EMBODIMENTS

Figure 13:
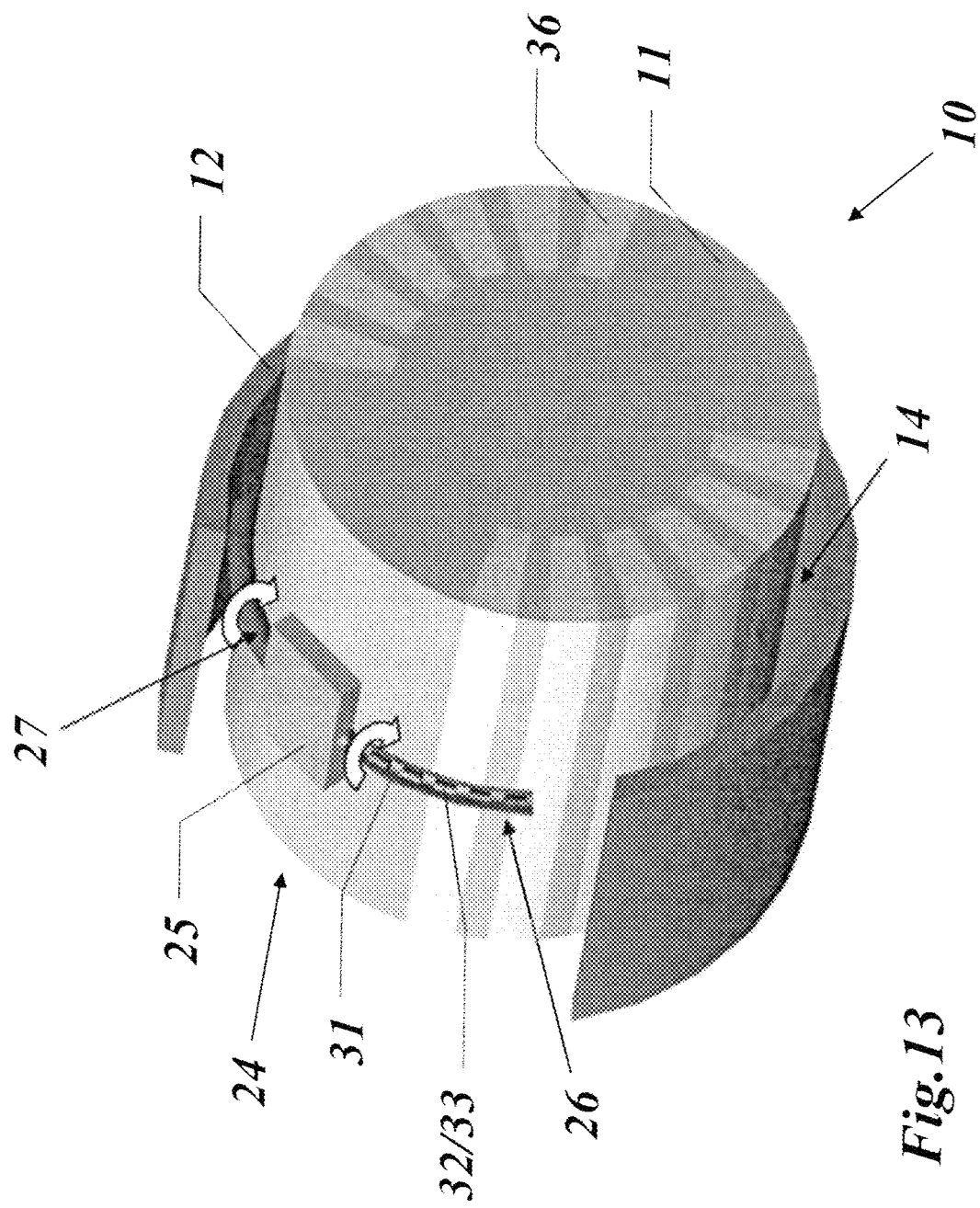
FIG. 13 shows in a perspective view the use of an inspection vehicle according to FIG. 5 in the air gap.

As shown in FIG. 13, a generator 10 has a rotor 11, which from the technical point of view is the ferromagnetic core of an electromagnet which rotates around the machine axis (13 in FIG. 4) in order to convert mechanical energy into electric energy. In order to form the magnet, windings 36 (normally formed of copper) of electrically good conductivity are installed in the rotor 11. These windings 36 are secured in corresponding slots by so-called "wedges". The wedges are produced from non-ferromagnetic material such as aluminum or stainless steel, so that the rotor surface in the region of the wedges is not suitable for magnetic attraction. The rotor 11 rotates in the stator 12. The gap which remains free between rotor 11 and stator 12, that is to say the air gap 14, has a width in the region of 20-30 mm.

Figure 5:
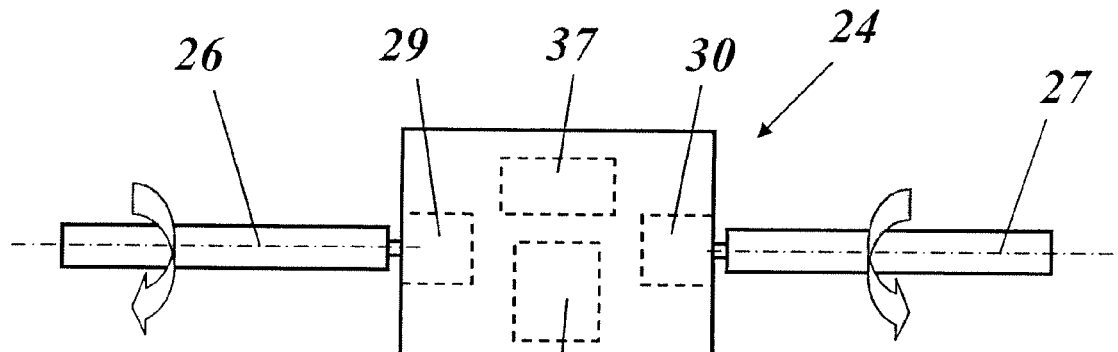
FIG. 5 shows an inspection vehicle of the type shown in FIG. 4, in plan view from above.

According to principles of the present invention, an inspection vehicle 24, which is provided with various instruments and sensors (for example cameras, measured value transducers, control electronics, communication electronics; see FIG. 5), is now introduced into the air gap 14. The instruments and sensors (37 in FIG. 5) or the associated control unit and electronics are accommodated in a housing 25 (or in a carrier structure 38 according to FIG. 8). The inspection vehicle 24 can be autonomously progressively moved in the air gap 14 by two or more drive elements 26, 27 which are formed as flexible magnetic rolls.

Figure 7:
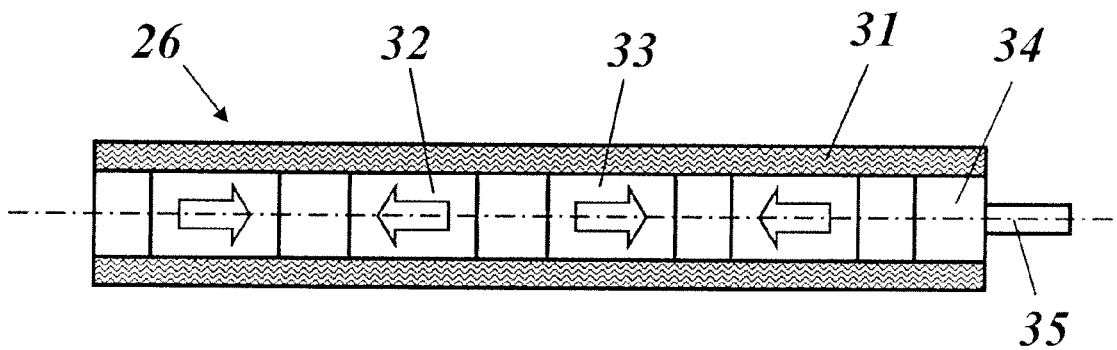
FIG. 7 shows the exemplary inner construction of a drive element of the inspection vehicle from FIG. 5.

A possible realization of such drive elements 26, 27 is reproduced in FIG. 7 and FIG. 13. In this example, a flexible tube 31, especially in the form of a rubber tube, is filled with a large number of individual cylindrical permanent magnets 32, 33 which are magnetized parallel to the longitudinal axis of the tube 31 and, for example, can be arranged in the tube alternating with the magnetizing direction (see FIG. 7), but do not necessarily have to be so. The length of the tube section is selected so that the tube section extends over a plurality of windings and therefore in any case covers a magnetizable region of the surface. Other solutions for the flexible tube are also conceivable, however (see FIG. 9 and FIG. 10). It is also conceivable to interconnect the permanent magnets themselves in a flexible but rotation-resisting manner in order to act as flexible magnetic rolls. Also, it is conceivable to produce the drive elements 26, 27 from a flexible magnetic solid material, for example from an elastomer or the like which is filled with magnetic particles.

Figure 6:
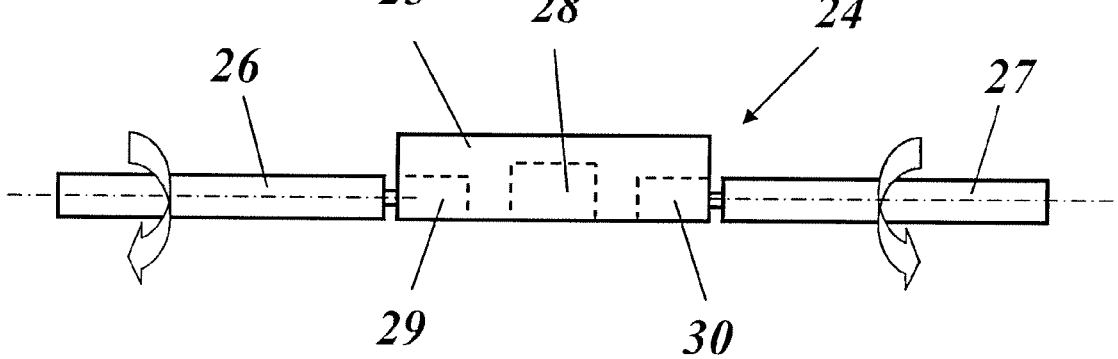
FIG. 6 shows the same inspection vehicle of FIG. 4 in side view.

The tube-like drive elements 26, 27 of the solution which is shown are equipped at one end in each case with a connecting element 34 which via a drive axis 35 is connected to a motor 29 or 30 which is accommodated in the housing 25 (FIGS. 5 and 6). The inspection vehicle 24 can be controlled by different directions of rotation and speeds of the drive elements 26, 27. This takes place, for example, by a control unit 28 which controls the motors 29 and 30.

Figure 4:
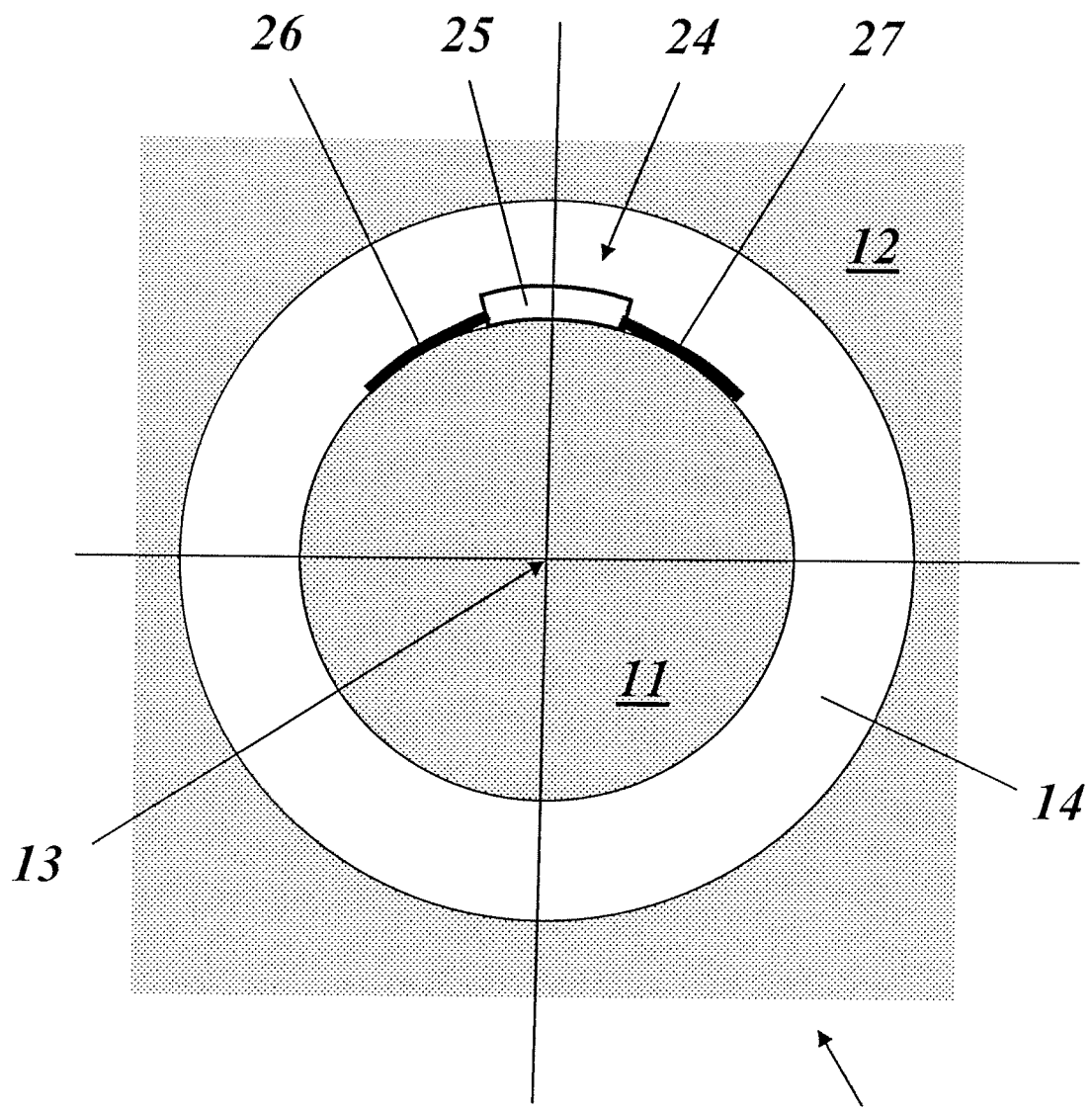
FIG. 4 shows, as seen in the axial direction, the use of an inspection vehicle according to an exemplary embodiment of the invention.

As is to be seen from FIG. 13 and FIG. 4, the flexible magnetic drive elements 26 and 27 adapt themselves to the curved outer surface of the rotor 11 (or to the curved inner surface of the stator 12) in order to hold the inspection vehicle 24 firmly on the surface and at the same time to create sufficient friction for the drive movement. The housing 25 of the inspection vehicle 24, if its dimensions are small in comparison to the circumference, can be flat in construction. It is also conceivable, however, to adapt the housing 25 to the curvature of rotor 11 and stator 12, as is shown in FIG. 4. Also, it is possible for the housing 25 itself to be of a flexible design so that it can be adapted to the curvature.

Figure 8:
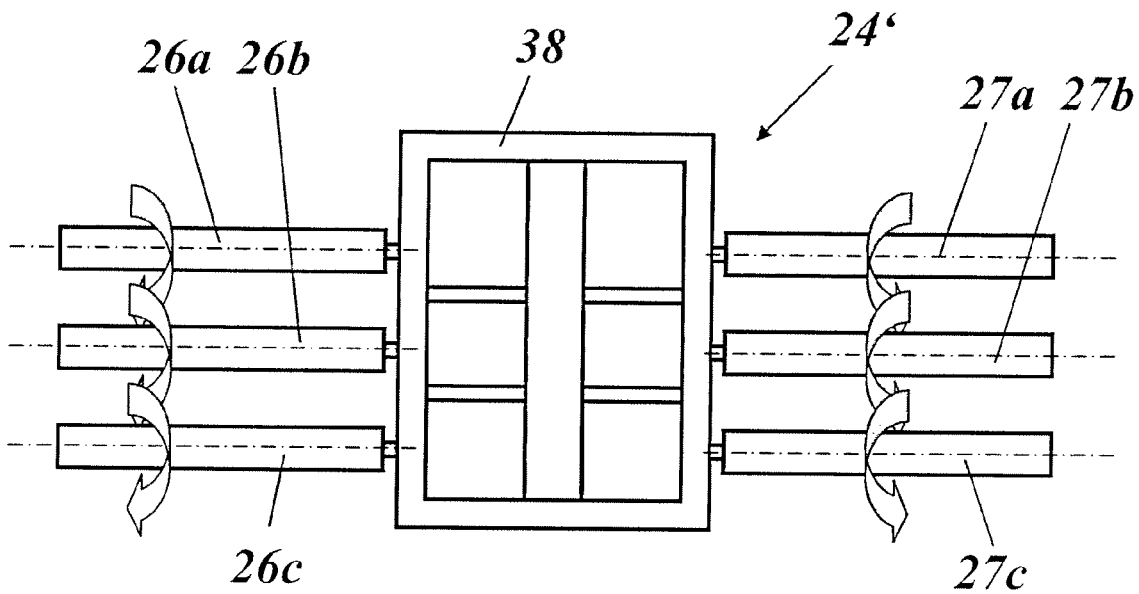
FIG. 8 shows, in a view which is comparable to FIG. 5, an inspection vehicle according to another exemplary embodiment of the invention with an open carrier structure for drive, control unit and sensors, and also a plurality of parallel drive elements on each side.

In order to increase the adherence to the surfaces which are to be inspected and at the same time to provide the friction which is necessary for the progressive movement, it can be advantageous to use an inspection vehicle 24' according to FIG. 8, in which a plurality of parallel drive elements 26a-c or 27a-c are arranged on each side. The synchronous rotation of the drive elements of each side can be achieved either via internal gears or via corresponding controlling of individual drive motors. Likewise, it can be advantageous to use an open carrier structure 38 for the fastening of the drive, control unit and sensors instead of the housing which is described above, because such a carrier structure 38 can be simply constructed in a flexionally elastic manner, for example by using thin metal strips.

Figure 9:
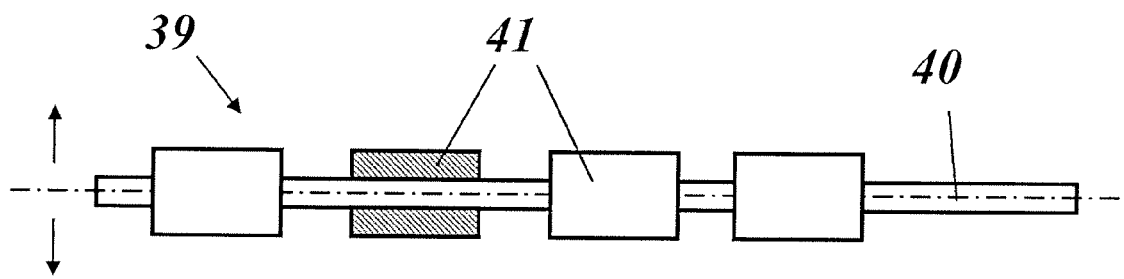
FIG. 9 shows, in a view which is comparable to FIG. 7, another drive element, in which hollow-cylindrical or ring-like permanent magnets are arranged in a rotation-resisting manner on a flexible, torsionally rigid shaft.
Figure 10:
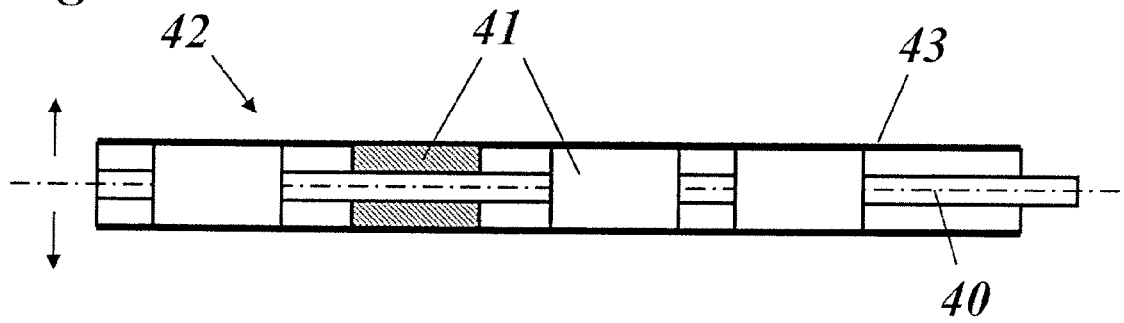
FIG. 10 shows a drive element corresponding to FIG. 9, in which the permanent magnets are protected by a thin protective sheath which is drawn over them.

Furthermore, instead of the rubber tubes which are filled with the permanent magnets, it is conceivable to provide flexionally elastic, torsionally rigid shafts 40 for the drive elements according to FIG. 9 or FIG. 10, on which hollow-cylindrical permanent magnets 41 are arranged one behind the other in the longitudinal direction in a rotation-resisting manner. The embodiment of the drive elements 39 according to FIG. 9, in which the permanent magnets 41 have direct contact with the surface which is to be inspected, is characterized by especially high holding forces, but is limited with regard to friction and is exposed to contaminants during operation. In order to achieve an improvement in this case, with the drive elements 42 according to FIG. 10 the arrangement of shaft 40 and permanent magnets 41 can be covered with a thin protective sheath 43 which weakens the holding forces comparatively little, but offers protection for the arrangement against contamination and, with a suitable selection of material, significantly improves friction.

Figure 11:
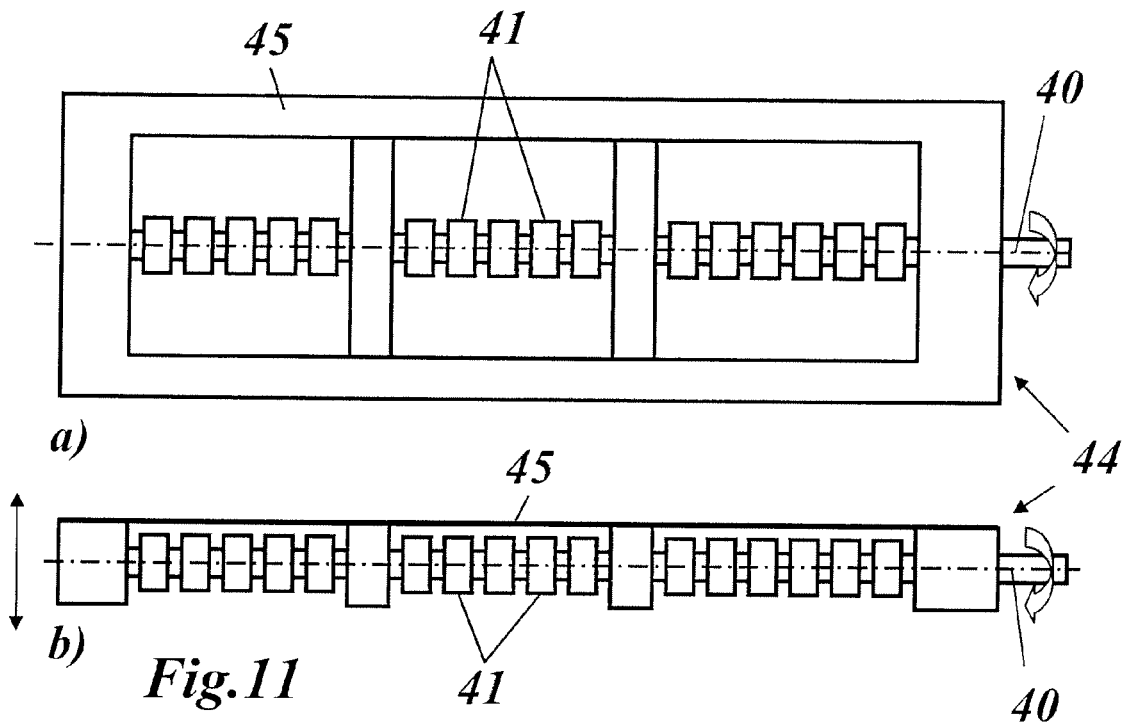
FIG. 11 shows in plan view from above (FIG. 11a) and in a side view (FIG. 11b) a drive element which is based on FIG. 9, in which the shafts with the permanent magnets are mounted in a flexible, simultaneously stabilizing frame.

The embodiments of the drive elements 26, 39 and 42 from FIGS. 7, 9 and 10 are basically equally flexible in all directions which are perpendicular to the rotational axis. On the other hand, in essence a bending flexibility which is perpendicular to the surface which is to be inspected is desired. In order to achieve such a directed flexibility with the drive elements, a construction according to FIG. 11 or FIG. 12 can be used. In one case, a shaft 40 which is equipped with hollow-cylindrical permanent magnets 41 (FIG. 11) is mounted in a frame 45 which, like the shaft 40, is similarly flexible in the direction which is perpendicular to the surface which is to be inspected, but prevents bending being carried out around an axis which is perpendicular to the surface which is to be inspected. The combination of shaft 40 and frame 45 therefore results in a drive element 44 with properties which are similar to a flat rubber mat.

Figure 12:
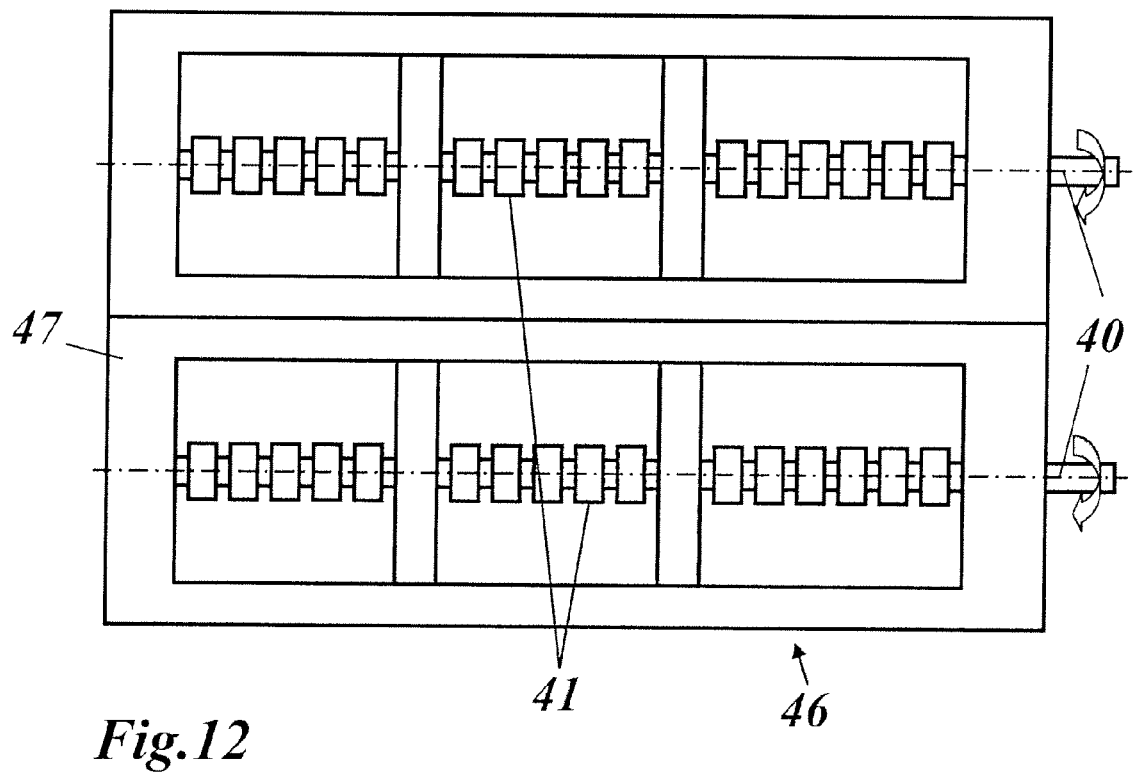
FIG. 12 shows in plan view from above a drive element which is comparable to FIG. 11, in which a plurality of parallel shafts are mounted in a flexible, simultaneously stabilizing frame.

According to FIG. 12, a plurality of shafts 40 with corresponding permanent magnets 41 can also be arranged horizontally parallel in a common frame 47 in order to form a corresponding drive element 46. Furthermore, it can be advantageous to attach or to connect the drive elements 44 or 46 with their frames 45 or 47 directly to a carrier structure 38 according to FIG. 8.

List of Designations

10 Generator
11 Rotor
12 Stator
13 Machine axis
14 Air gap
15 Sensor carrier
16, 17 Reel
18 Wire
19 Band
20 Roll-up mechanism
21 Robot
22, 23 Tracked drive
24, 24' Inspection vehicle
25 Housing
26, 27 Drive element
26a-c Drive element
27a-c Drive element
28 Control unit
29, 30 Motor
31 Flexible tube (for example rubber tube)
32, 33 Permanent magnet (cylindrical)
34 Connecting element
35 Drive axis
36 Winding
37 Sensor
38 Carrier structure
39, 42 Drive element
40 Shaft (flexible)
41 Permanent magnet (hollow-cylindrical)
43 Protective sheath
44, 46 Drive element
45, 47 Frame While the invention has been described in detail with reference to exemplary embodiments thereof, it will be apparent to one skilled in the art that various changes can be made, and equivalents employed, without departing from the scope of the invention. The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

We claim:

1. An inspection vehicle for inspecting an air gap between the rotor and the stator of a generator, the inspection vehicle comprising:
   a housing or a carrier structure; and
   at least one rotatable drive element extending from opposite sides of the housing or of the carrier structure for moving the housing or carrier structure in the air gap, the drive elements comprising elongated, flexionally elastic, torsionally rigid, magnetic rolls to magnetically engage a portion of the outer circumference of the rotor or a portion of the inner circumference of the stator.

2. The inspection vehicle as claimed in claim 1, wherein the drive elements are each shaped as a flexible tube.

3. The inspection vehicle as claimed in claim 1, further comprising:
   a plurality of permanent magnets arranged inside each of the drive elements one behind the other along a longitudinal direction of each drive element.

4. The inspection vehicle as claimed in claim 1, wherein each of the drive elements comprises:
   a flexionally elastic, torsionally rigid shaft; and
   a plurality of permanent magnets on the shaft in a rotation-resisting manner and positioned one behind the other in a longitudinal direction of the shaft.

5. The inspection vehicle as claimed in claim 3, wherein the permanent magnets are cylindrical or hollow-cylindrical with a cylinder axis, and the cylinder axis is oriented parallel to a longitudinal axis of the drive elements.

6. The inspection vehicle as claimed in claim 4, wherein the permanent magnets are cylindrical or hollow-cylindrical with a cylinder axis, and the cylinder axis is oriented parallel to a longitudinal axis of the drive elements.

7. The inspection vehicle as claimed in claim 5, wherein the permanent magnets are each magnetized parallel to the cylinder axis.

8. The inspection vehicle as claimed in claim 6, wherein the permanent magnets are each magnetized parallel to the cylinder axis.

9. The inspection vehicle as claimed in claim 2, further comprising:
   a flexible tube, the permanent magnets of one of said drive elements being positioned inside the flexible tube.

10. The inspection vehicle as claimed in claim 3, further comprising:
    a flexible tube, the permanent magnets of one of said drive elements being positioned inside the flexible tube.

11. The inspection vehicle as claimed in claim 9, wherein the flexible tube comprises a rubber tube.

12. The inspection vehicle as claimed in claim 10, wherein the flexible tube comprises a rubber tube.

13. The inspection vehicle as claimed in claim 9, wherein the flexible tube has a constant outside diameter.

14. The inspection vehicle as claimed in claim 4, further comprising:
    a protective sheath, the permanent magnets covered with the protective sheath.

15. The inspection vehicle as claimed in claim 1, further comprising:
    at least one sensor disposed on the housing or carrier structure to provide a signal indicative of a parameter of the air gap.

16. The inspection vehicle as claimed in claim 1, wherein a plurality of drive elements are positioned on each side of the housing or of the carrier structure.

17. The inspection vehicle as claimed in claim 1, wherein:
    the drive elements have longitudinal axes arranged parallel to each other; and
    the drive elements are connected to the housing or to the carrier structure so that they are rotatable around their longitudinal axes.

18. The inspection vehicle as claimed in claim 1, further comprising:
    a motor for each drive element in the housing or on the carrier structure; and
    wherein the drive elements are individually driven by a motor which sets the associated drive element in rotation around a longitudinal axis of the drive element.

19. The inspection vehicle as claimed in claim 18, further comprising:
    a control unit configured and arranged to control the motors, the control unit positioned in the housing or on the carrier structure.

20. The inspection vehicle as claimed in claim 18, wherein the rotational direction of the drive elements is each variable.

21. The inspection vehicle as claimed in claim 1, further comprising:
    flexionally elastic frames; and
    wherein the flexionally elastic, torsionally rigid, magnetic rolls of the drive elements are mounted in the flexionally elastic frames which prevent distortion of the rolls around an axis which is perpendicular to the roll surface of the rolls.

22. The inspection vehicle as claimed in claim 1, wherein each of the rolls has a length sufficiently long to extend across at least one windings portion of the rotor or of the generator.

23. An inspection vehicle useful for inspecting an air gap between the rotor and the stator of a generator, the inspection vehicle comprising:
    rotatable drive elements configured and arranged for moving the inspection vehicle in the air gap, the drive elements comprising elongated, flexionally elastic, torsionally rigid, magnetic rolls in order to hold the inspection vehicle firmly on an outer surface of the rotor or on an inner surface of the stator when moving through the air gap.

* * * * *